(12) United States Patent
Chiu et al.

(10) Patent No.: US 9,729,123 B2
(45) Date of Patent: Aug. 8, 2017

(54) COMMON-MODE FILTER

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Po-Wei Chiu, Miaoli County (TW); Jia-Liang Chen, Kaohsiung (TW); Ling-Chih Chou, New Taipei (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 96 days.

(21) Appl. No.: 14/863,458

(22) Filed: Sep. 24, 2015

(65) Prior Publication Data
US 2017/0012595 A1 Jan. 12, 2017

(30) Foreign Application Priority Data
Jul. 6, 2015 (CN) .......................... 2015 1 0388876

(51) Int. Cl.
*H03H 7/01* (2006.01)
*H03H 7/42* (2006.01)
*H03H 1/00* (2006.01)

(52) U.S. Cl.
CPC .......... *H03H 7/427* (2013.01); *H03H 7/0115* (2013.01); *H03H 7/0123* (2013.01); *H03H 7/1758* (2013.01); *H03H 2001/0085* (2013.01)

(58) Field of Classification Search
CPC .... H03H 7/427; H03H 7/0115; H03H 7/0138; H03H 1/0007; H03H 7/0123; H03H 7/1758; H03H 2001/0085
(Continued)

(56) References Cited

U.S. PATENT DOCUMENTS

| 7,932,793 B2 | 4/2011 | Wu | |
|---|---|---|---|
| 2016/0142031 A1* | 5/2016 | Ueki | H03H 7/09 361/56 |

OTHER PUBLICATIONS

Wei-Tzong Liu et al., "An Embedded Common-Mode Suppression Filter for GHz Differential Signals Using Periodic Defected Ground Plane", IEEE Microwave and Wireless Components Letters, vol. 18, No. 4, Apr. 2008.

* cited by examiner

*Primary Examiner* — Benny Lee
*Assistant Examiner* — Jorge Salazar, Jr.
(74) *Attorney, Agent, or Firm* — CKC & Partners Co., Ltd.

(57) ABSTRACT

A common-mode filter includes a first transmission line, a second transmission line, a first wiring layer, a second wiring layer and a third wiring layer. The first wiring layer includes a first conductive capacitor plate, in which at least partial first transmission line is in the first wiring layer, and electrically coupled with the first conductive capacitor plate. The second wiring layer includes a second conductive plate and a first inductor, and the second conductive capacitor plate is electrically coupled with the first inductor. The third wiring layer includes a third conductive capacitor plate, in which at least partial second transmission line is in the second wiring layer, and electrically coupled with the third conductive capacitor plate. The first conductive capacitor plate at least partial faces the second conductive capacitor plate, and the second conductive capacitor plate at least partial faces the third conductive capacitor plate.

15 Claims, 7 Drawing Sheets

(58) Field of Classification Search
USPC .................................................. 333/181, 185
See application file for complete search history.

COMMON-MODE FILTER

RELATED APPLICATIONS

This application claims priority to China Application Serial Number 201510388876.2, filed Jul. 6, 2015, which is herein incorporated by reference.

BACKGROUND

Technical Field

The present disclosure relates to a filter, and more particularly, to a common-mod filter and a circuit structure including the common-mode filter.

Description of Related Art

As human demands for electronic devices become more sophisticated, the feature of high transmission efficiency has become the basic requirement of a new generation of electronic devices. However, in meeting the needs of high efficient transmission, it certainly caused some unexpected circumstances. For example, if the transmission frequency of a signal is continuously increased, the electromagnetic wave is also easy to spread through mediums, resulting in the so-called electromagnetic interference (EMI). The EMI is harmful to the human body and may also cause the produced circuit layout not to pass some security certification specifications.

Under the circumstances, differential transmission-lines that are resistant to the EMI and less susceptible to ground voltage disturbance are therefore widely used. However, in order to contain complicated circuit structures in a limited circuit layout, the differential transmission-lines must have turning points or corners. The turning points or corners often make the differential transmission-lines have unequal lengths so as to generate common-mode noises.

Therefore, some methods for suppressing the common-mode noises have been proposed. For example, the common-mode chock is the most typical one. The common-mode chock is made by winding two independent coils having the same number of turns onto a magnet. The common-mode chock is structurally equivalent to a winding magnetic core, can generate a high conductivity impedance to common-mode noises, and can generate an impedance of almost zero to differential mode signals. However, common-mode chokes usually only work in the MHz range. Because of the frequency characteristics and the parasitic effect of ferromagnetic materials, the common-mode chokes are difficult to be designed at high frequencies over GHz. In addition, the complicated structures of the common-mode chokes are less suitable for miniaturization of circuit nowadays.

Accordingly, a kind of common-mode filters using patterned ground structures to eliminate common-mode noises have been proposed, which can work in the GHz range and have lower costs. However, because the sizes of the patterned ground structures must be half or quarter of the wavelength of transmission signals, the patterned ground structures will occupy a large ground area of a printed circuit board, so that the common-mode filters can not effectively reduce the production areas.

To sum up, how to provide a common-mode filter to solve the shortcomings of too large areas and high frequency operation inefficiencies in the prior arts becomes an important issue to be solved by those in the industry.

SUMMARY

An aspect of the disclosure is to provide a common-mode filter.

According to an embodiment of the disclosure, a common-mode filter includes a first transmission line, a second transmission line, a first wiring layer, a second wiring layer, and a third wiring layer. The first wiring layer includes a first conductive capacitor plate, in which at least a part of the first transmission line is located in the first wiring layer, and the first transmission line is electrically coupled with the first conductive capacitor plate. The second wiring layer includes a second conductive plate and a first inductor, and the second conductive capacitor plate is electrically coupled with the first inductor. The third wiring layer includes a third conductive capacitor plate, in which at least a part of the second transmission line is located in the second wiring layer, and the second transmission line is electrically coupled with the third conductive capacitor plate. At least a part of the first conductive capacitor plate faces the second conductive capacitor plate, and at least a part of the second conductive capacitor plate faces the third conductive capacitor plate.

Because at least a part of the first conductive capacitor plate faces the second conductive capacitor plate and at least a part of the second conductive capacitor plate faces the third conductive capacitor plate, the first conductive capacitor plate and the second conductive capacitor plate can form a first capacitor, and the second conductive capacitor plate and the third conductive capacitor plate can form a second capacitor. Furthermore, because the first inductor is electrically coupled with the second conductive capacitor plate, a LC circuit can be formed among the first conductive capacitor plate, the second conductive capacitor plate, the third conductive capacitor plate, and the first inductor. By adjusting the values of inductance and capacitance in the foregoing LC circuit, the LC circuit can be used as a common-mode filter.

Another aspect of the disclosure is to provide a circuit structure.

According to an embodiment of the disclosure, a circuit structure includes a first transmission line, a second transmission line, a first wiring layer, a second wiring layer, a third wiring layer, and a first through hole. The first wiring layer includes a first conductive capacitor plate, in which at least a part of the first transmission line is located in the first wiring layer, and the first transmission line is electrically coupled with the first conductive capacitor plate. The second wiring layer includes a second conductive plate and a first inductor, and the second conductive capacitor plate is electrically coupled with the first inductor. The third wiring layer includes a third conductive capacitor plate. The first through hole is across the first wiring layer, the second wiring layer, and the third wiring layer, in which the second transmission line is electrically coupled with the third conductive capacitor plate via the first through hole. At least a part of the first conductive capacitor plate faces the second conductive capacitor plate, and at least a part of the second conductive capacitor plate faces the third conductive capacitor plate.

The foregoing circuit structure forms a common-mode filter in the transmission paths of the first transmission line and the second transmission line. Furthermore, for the plurality of wiring layers, it is necessary to form through holes to electrically couple different wiring layers. By forming structures such as conductive capacitor plates and inductors in different wiring layers, the circuit structure makes the first transmission line and the second transmission line across different wiring layers form a LC filter circuit. The circuit structure is simple to manufacture and can form the common-mode filter in the transmission paths of the first transmission line and the second transmission line without increasing the existing circuit layout area.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference r lade to the accompanying drawings as follows.

DETAILED DESCRIPTION

Figure 1:
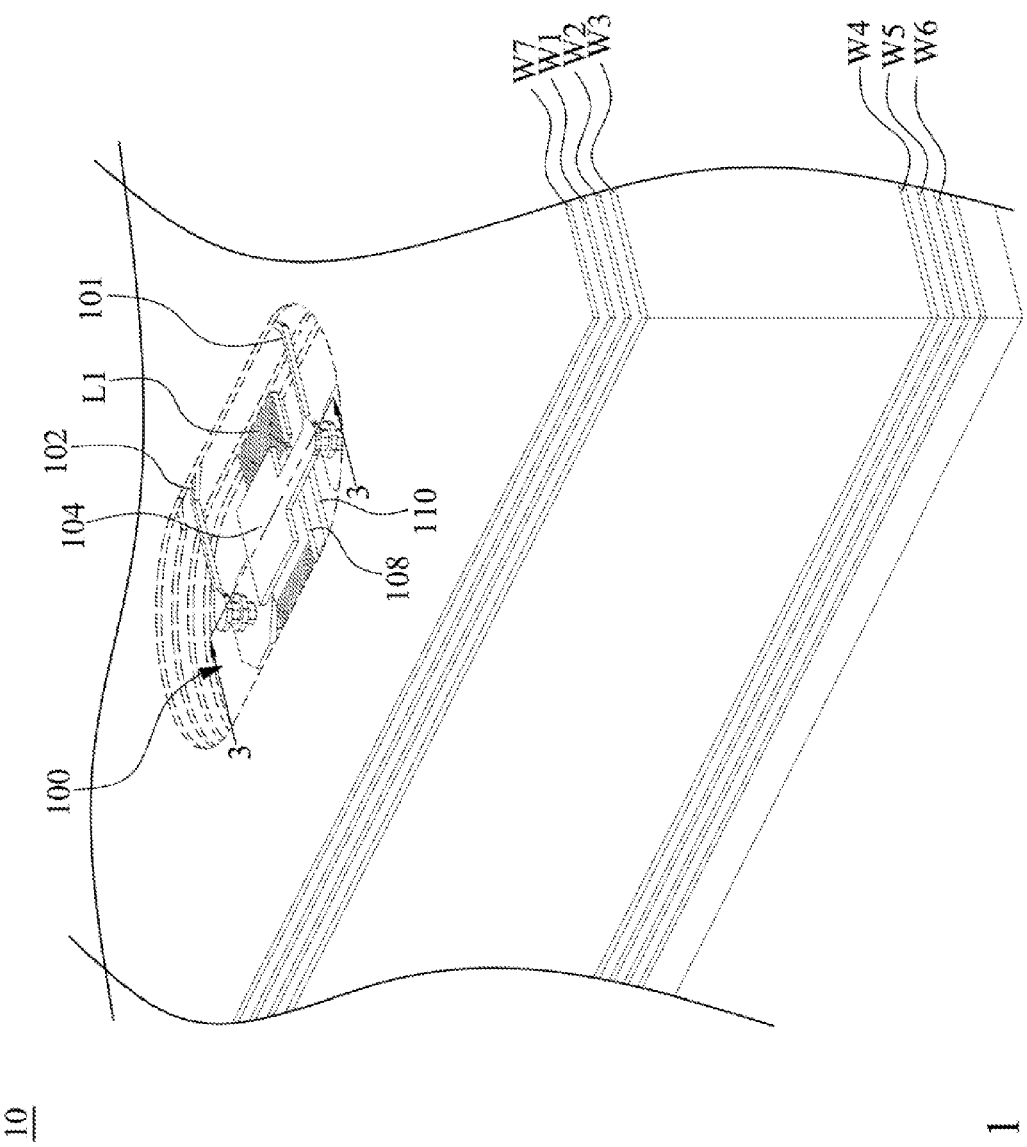
FIG. 1 is a partial perspective view of a circuit structure according to an embodiment of the disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2:
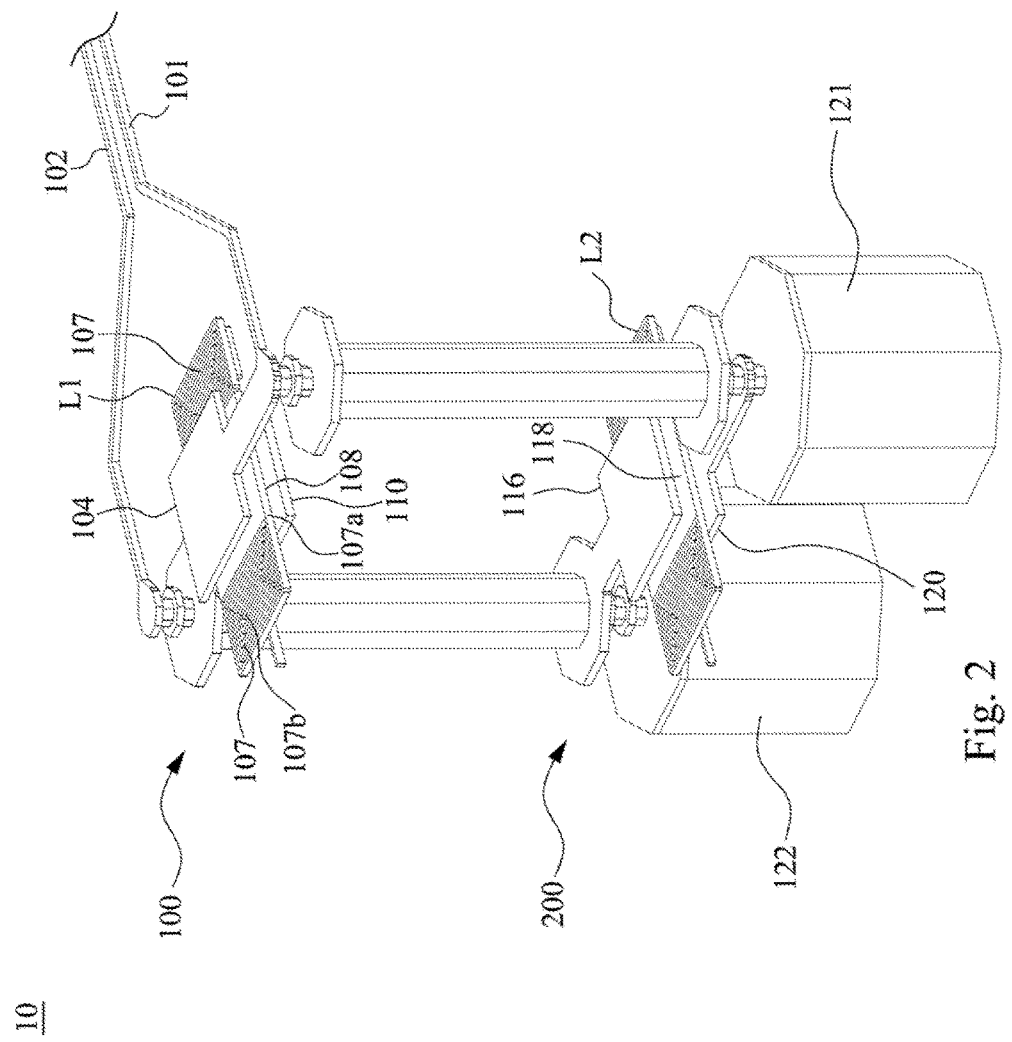
FIG. 2 is a perspective view of a common-mode filter n a circuit structure according to an embodiment of the disclosure.
Figure 3:
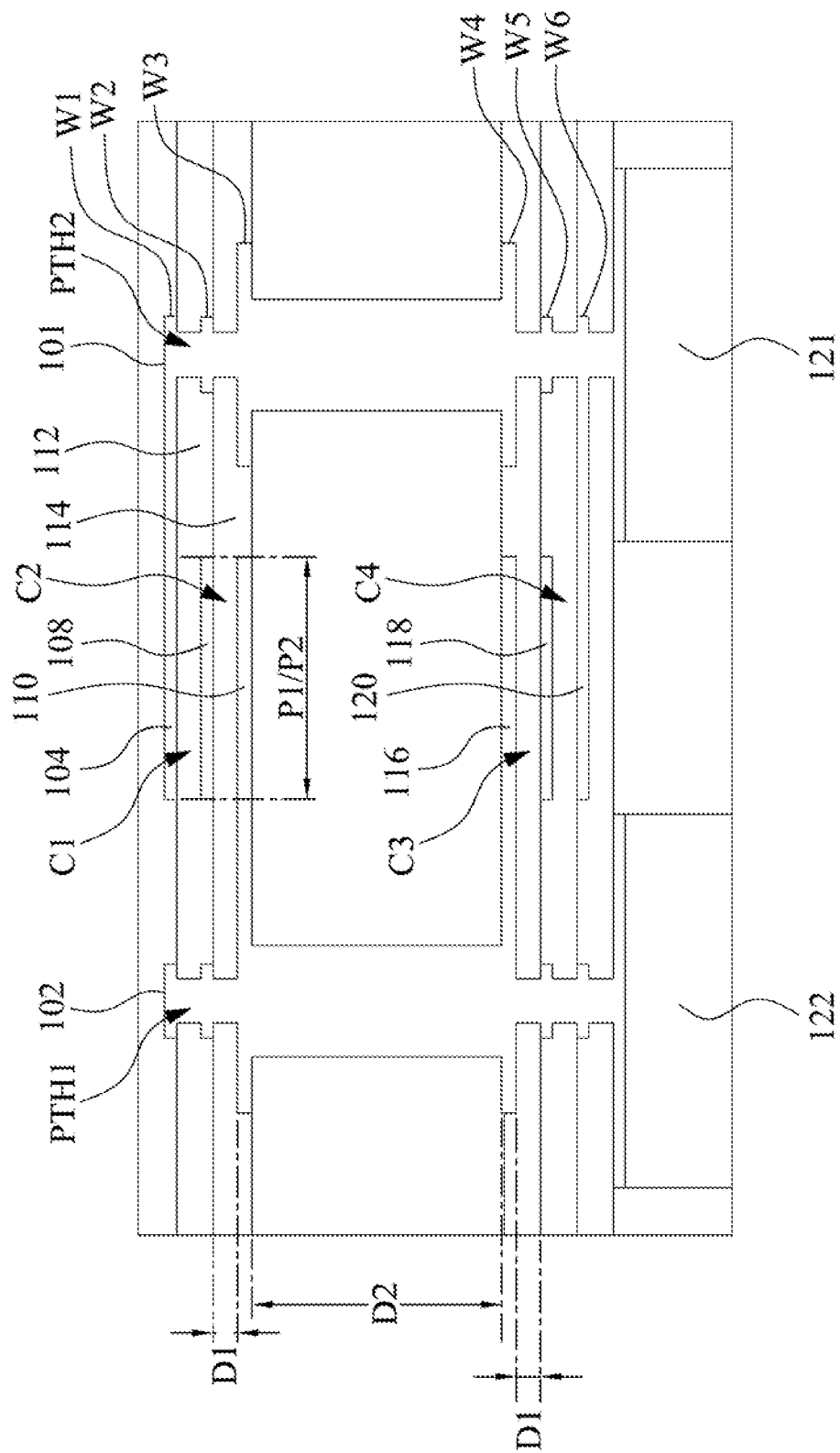
FIG. 3 is a cross-sectional view of FIG. 1 along line 3-3.

FIG. 1 is a partial perspective view of a circuit structure according to an embodiment of the disclosure. FIG. 2 is a perspective view of a common-mode filter in a circuit structure according to an embodiment of the disclosure. FIG. 3 is a cross-sectional view of FIG. 1 along line 3-3. As shown in FIG. 1 to FIG. 3, a circuit structure 10 includes a first transmission line 101, a second transmission line 102, a first wiring layer W1, a second wiring layer W2, a third wiring layer W3, and a first through hole PTH1 (FIG. 3). In the embodiment, the first through hole PTH1 is a micro-via, but the disclosure is not limited in this regard. In practical applications, the first through hole PTH1 can be a plating through hole.

The first wiring layer W1 includes a first conductive capacitor plate 104, in which at least a part of the first transmission line 101 is located in the first wiring layer W1, and the first transmission line 101 is electrically coupled with the first conductive capacitor plate 104. The second wiring layer W2 includes a second conductive plate 108 and a first inductor L1, and the second conductive capacitor plate 108 is electrically coupled with the first inductor L1. The third wiring layer W3 includes a third conductive capacitor plate 110. The first through hole PTH1 is across the first wiring layer W1, the second wiring layer W2, and the third wiring layer W3, in which the second transmission line 102 is electrically coupled with the third conductive capacitor plate 110 via the first through hole PTH1.

In the embodiment, in the stacking direction of the first wiring layer W1, the second wiring layer W2, and the third wiring layer W3, at least a part of the first conductive capacitor plate 104 faces the second conductive capacitor plate 108, and at least a part of the second conductive capacitor plate 108 faces the third conductive capacitor plate 110. As a result, the first conductive capacitor plate 104 and the second conductive capacitor plate 108 can form a first capacitor C1 (FIG. 3), and the second conductive capacitor plate 108 and the third conductive capacitor plate 110 can form a second capacitor C2 (FIG. 3). In addition, because the first inductor L1 is electrically coupled with the second conductive capacitor plate 108, a LC circuit can be formed among the first conductive capacitor plate 104, the second conductive capacitor plate 108, the third conductive capacitor plate 110, and the first inductor L1. Because the LC circuit has the function of filtering, and the operation frequencies and bandwidth of the LC circuit can be determined by the values of inductance and capacitance, the circuit structure 10 of the embodiment can be used as a common-mode filter.

Furthermore, the embodiment forms conductive capacitor plates and inductor among the plurality of wiring layers, so as to form a filter in the wiring layers. In an embodiment of the disclosure, the first transmission line 101 and the second transmission line 102 can be used to transmit differential-mode signals. In order to effectively suppress common-mode noises in the differential-mode signals, a LC filter circuit can be formed in the transmission paths of the first transmission line 101 and the second transmission line 102. In addition, by adjusting the values of inductance and capacitance in the LC filter circuit, the LC filter circuit can effectively suppress the common-mode noises in certain frequency band. That is, the first conductive capacitor plate 104, the second conductive capacitor plate 108, the third conductive capacitor plate 110, and the first inductor L1 shown in FIG. 1 to FIG. 3 can be used as a common-mode filter, which is simple to manufacture without occupying a lot of area.

In an embodiment, a first orthogonal projection P1 of the first conductive capacitor plate 104 on the third wiring layer W3 overlaps a second orthogonal projection P2 of the second conductive capacitor plate 108 on the third wiring layer W3, and the first orthogonal projection P1 and the second orthogonal projection P2 also overlap the third conductive capacitor plate 110. That is, any two adjacent ones of the first conductive capacitor plate 104, the second conductive capacitor plate 108, and the third conductive capacitor plate 110 face each other, but the disclosure is not limited in this regard. In some embodiments, the first conductive capacitor plate 104 is unnecessary to face the third conductive capacitor plate 110. As long as the first conductive capacitor plate 104 and the second conductive capacitor plate 108 form the first capacitor C1, the second conductive capacitor plate 108 and the third conductive capacitor plate 110 form the second capacitor C2, and the first inductor L1 is electrically coupled with the second conductive capacitor plate 108, the LC circuit having the function of filtering can be formed.

In an embodiment, the circuit structure 10 further includes a first dielectric layer 112 and a second dielectric layer 114. The first dielectric layer 112 is located between the first wiring layer W1 and the second wiring layer W2, and the second dielectric layer 114 is located between the second wiring layer W2 and the third wiring layer W3. Furthermore, the first dielectric layer 112 can be located between the first conductive capacitor plate 104 of the first wiring layer W1 and the second conductive capacitor plate 108 of the second wiring layer W2 to separate the first conductive capacitor plate 104 and the second conductive capacitor plate 108, and the second dielectric layer 114 can be located between the second conductive capacitor plate 108 of the second wiring layer W2 and the third conductive capacitor plate 110 of the third wiring layer W3 to separate the second conductive capacitor plate 108 and the third conductive capacitor plate 110, so as to make the first conductive capacitor plate 104 and the second conductive capacitor plate 108 form the first capacitor C1 and make the second conductive capacitor plate 108 and the third conductive capacitor plate 110 form the second capacitor C2, but the disclosure is not limited in this regard. In some embodiments, the first capacitor C1 and the second capacitor C2 can be air dielectric capacitors. That is, there can be no dielectric layer between the first conductive capacitor plate 104 and the second conductive capacitor plate 108 and between the second conductive capacitor plate 108 and the third conductive capacitor plate 110.

As shown in FIG. 1 to FIG. 3, the circuit structure 10 further includes a second through hole PTH2 (FIG. 3). The second through hole PTH2 is across the first wiring layer W1, the second wiring layer W2, and the third wiring layer W3, in which at least a part of the first transmission line 101 is located in the second through hole PTH2. In addition, the first conductive capacitor plate 104, the second conductive capacitor plate 108, and the third conductive capacitor plate 110 are located between the first through hole PTH1 and the second through hole PTH2. In the embodiment, the second through hole PTH2 is a plating through hole.

Furthermore, in the circuit structure 10 having a plurality of the wiring layers, it is necessary to form through holes to electrically couple the different wiring layers. In the embodiment of the disclosure, the first transmission line 101 and the second transmission line 102 that can transmit differential-mode signals are at least partially located in the second through hole PTH2 and the first through hole PTH1, respectively. Therefore, by manufacturing the first conductive capacitor plate 104, the second conductive capacitor plate 108, the third conductive capacitor plate 110 between the first through hole PTH1 and the second through hole PTH2, the space between the first through hole PTH1 and the second through hole PTH2 can be effectively used, and the common-mode filter 100 can be formed in the transmission paths of the first transmission line 101 and the second transmission line 102 without increasing the existing circuit layout area.

As shown in FIG. 3, in an embodiment, the second wiring layer W2 is located between the first wiring layer W1 and the third wiring layer W3. That is, the second conductive capacitor plate 108 of the second wiring layer W2 is electrically coupled with the first inductor L1 and located between the first conductive capacitor plate 104 and the third conductive capacitor plate 110, and the structure that the first inductor L1 electrically coupled between the first capacitor C1 and the second capacitor C2 forms the LC filter circuit, but the disclosure is not limited in this regard.

Figure 4:
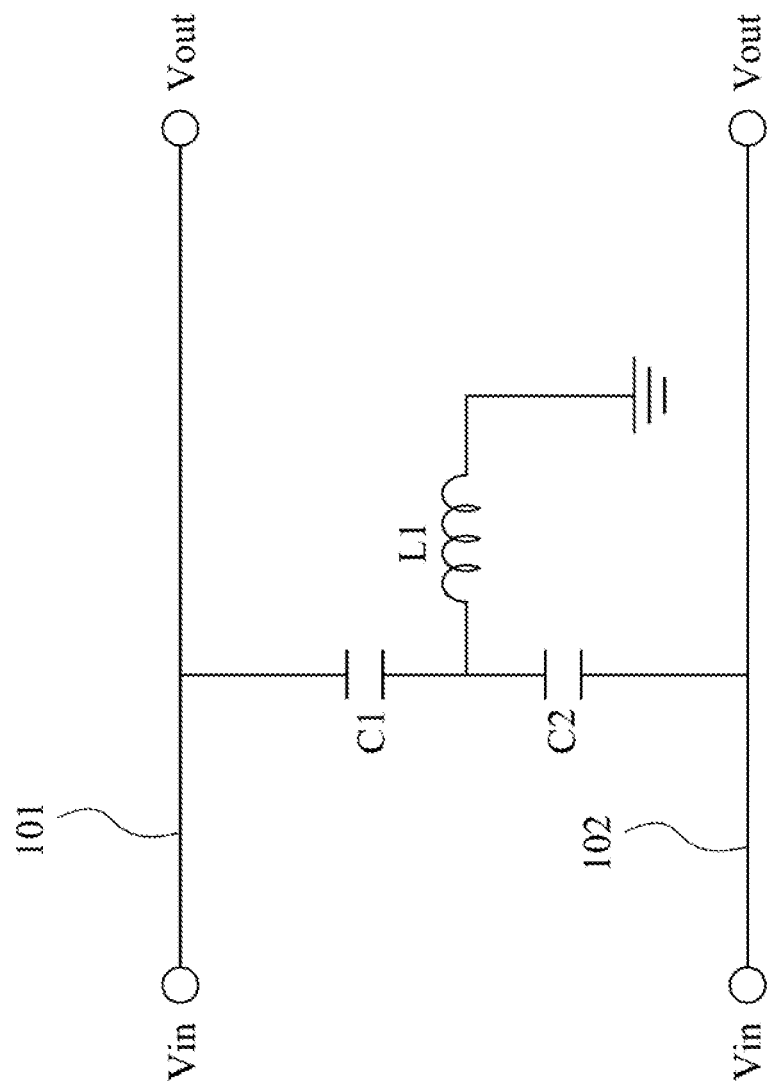
FIG. 4 is an equivalent circuit diagram of a common-mode filter according to an embodiment of the disclosure.

Referring to FIG. 3 and FIG. 4. FIG. 4 is an equivalent circuit diagram of the common-mode filter 100 according to an embodiment of the disclosure. As shown in the figures, the equivalent circuit of the common-mode filter 100 can be a LC circuit, in which the first inductor L1 can be electrically coupled with a ground potential. That is, the first inductor L1 can be electrically coupled between the second conductive capacitor plate 108 and the ground potential. As a result, when the first transmission line 101 and the second transmission line 102 transmit differential-mode signals from an input end $V_{in}$, because the differential-mode signals have the same amplitude and opposite phases, the differential-mode signals will not be transmitted through the first inductor L1. That is, for the differential-mode signals, the first inductor L1 does not exist. When there exist common-mode noises between the first transmission line 101 and the second transmission line 102, because the phases of the common ode noises are the same. Hence, when the common-mode noises meet the resonant frequency of the LC circuit, the common-mode noises will oscillate in the LC circuit without being transmitted to an output end $V_{out}$. Therefore, when the differential-mode signals inputted from the input end $V_{in}$ of the first transmission line 101 and the second transmission line 102 have common-mode noises, only the differential-mode signals can reach the output end $V_{out}$, so as to achieve the purpose of suppressing the common-mode noises.

Figure 5:
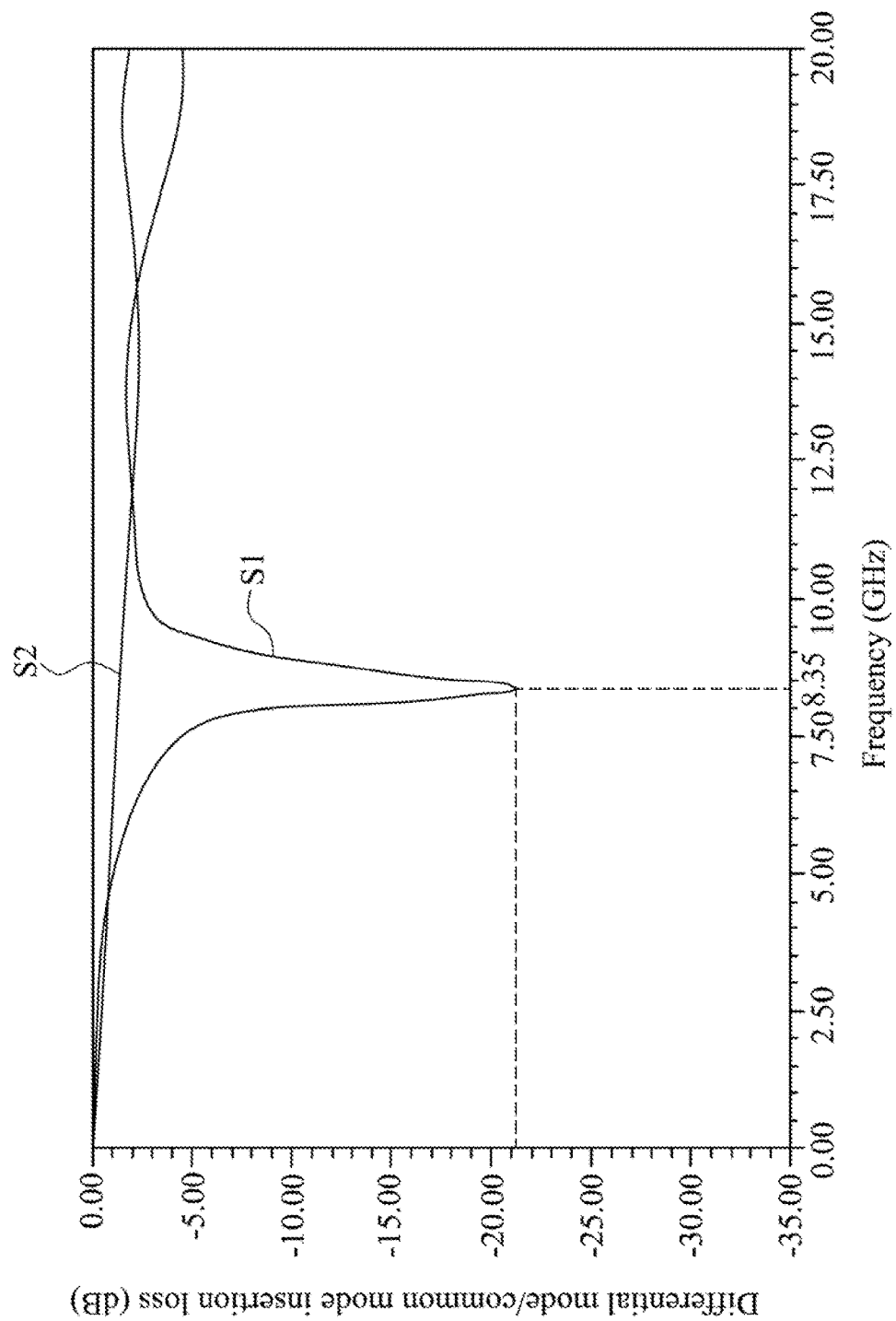
FIG. 5 is an analysis diagram of differential-mode/common-mode insertion loss according to an embodiment of the disclosure.

FIG. 5 is an analysis diagram of differential-mode/common-mode insertion loss according to an embodiment of the disclosure. As shown in FIG. 5, at a frequency of about 8.35 GHz of the common-mode noise S1, the corresponding insertion loss is about 21 dB. In addition, the common-mode noise S2 is not affected, which represents that when the center frequency of the transmitted signals occurs at 8.35 GHz, the common-mode filter 100 in the circuit structure 10 can effectively suppress the common-mode noises in the differential-mode signals.

Referring back to FIG. 2 and FIG. 3. In some embodiments, the circuit structure 10 further includes a fourth wiring layer W4, a fifth wiring layer W5, and a sixth wiring layer W6. The fourth wiring layer W4 includes a fourth conductive capacitor plate 116. The fifth wiring layer W5 includes a fifth conductive plate 118 and a second inductor L2 (FIG. 2), and the fifth conductive capacitor plate 118 is electrically coupled with the second inductor L2. The sixth wiring layer W6 includes a sixth conductive capacitor plate 120. In addition, the first through hole PTH1 and the second through hole PTH2 are across the first wiring layer W1, the second wiring layer W2, the third wiring layer W3, the fourth wiring layer W4, the fifth wiring layer W5, and the sixth wiring layer W6. The first transmission line 101 can be electrically coupled with the sixth conductive capacitor plate 120 via the second through hole PTH2, and the second transmission line 102 can be electrically coupled with the fourth conductive capacitor plate 116 via the first through hole PTH1.

In the stacking direction of the fourth wiring layer W4, the fifth wiring layer W5, and the sixth wiring layer W6, at least a part of the fourth conductive capacitor plate 116 faces the fifth conductive capacitor plate 118, and at least a part of the fifth conductive capacitor plate 118 faces the sixth conductive capacitor plate 120. As a result, the fourth conductive capacitor plate 116 and the fifth conductive capacitor plate 118 form a third capacitor C3 (FIG. 3), and the fifth conductive capacitor plate 118 and the sixth conductive capacitor plate 120 form a fourth capacitor C4 (FIG. 3). In addition, because the second inductor L2 is electrically coupled with the fifth conductive capacitor plate 118, another LC filter circuit can be formed among the fourth conductive capacitor plate 116, the fifth conductive capacitor plate 118, the sixth conductive capacitor plate 120, and the second inductor L2.

In addition, the operation frequencies and bandwidth of the LC filter circuit can be determined by adjusting the values of inductance and capacitance in the LC filter circuit, so that the fourth conductive capacitor plate 116, the fifth conductive capacitor plate 118, the sixth conductive capacitor plate 120, and the second inductor L2 can work as another common-mode filter 200 in the circuit structure 10. As a result, by forming two common-mode filters 100, 200 in the circuit structure 10, the common-mode noises having two different center frequencies in the circuit structure 10 can be filtered.

As shown in FIG. 3, in an embodiment, any two adjacent ones of the first wiring layer W1, the second wiring layer W2, and the third wiring layer W3 are separated by a first distance D1, any two adjacent ones of the fourth wiring layer W4, the fifth wiring layer W5, and the sixth wiring layer W6 are separated by the first distance D1, the third wiring layer W3 and the fourth wiring layer W4 are separated by a second distance 02, and the second distance D2 is greater than the first distance D1, so as to prevent the common-mode filter 100 and the common-mode filter 200 in the circuit structure 10 from being too close to affect each other. For example, if the third conductive capacitor plate 110 and the fourth conductive capacitor plate 116 are too close, a parasitic capacitance that can not be ignored may be generated and changes the operation frequencies of the common-mode filters 100, 200. In an embodiment, the first distance D1 can be 30 micrometer, the second distance D2 can be 800 micrometer, but the disclosure is not limited in this regard.

As shown in FIG. 2 and FIG. 3, the fourth conductive capacitor plate 116, the fifth conductive capacitor plate 118, and the sixth conductive capacitor plate 120 are located between the first through hole PTH1 and the second through hole PTH2. In the circuit structure 10 having a plurality of the wiring layers, it is necessary to form through holes to electrically couple the different wiring layers. Therefore, by manufacturing the fourth conductive capacitor plate 116, the fifth conductive capacitor plate 118, and the sixth conductive capacitor plate 120 between the first through hole PTH1 and the second through hole PTH2, the common-mode filter 200 can be formed in the transmission paths of the first transmission line 101 and the second transmission line 102 without increasing the existing circuit layout area.

As shown in FIG. 3, in an embodiment, the fifth wiring layer W5 is electrically coupled with the second inductor L2 and located between the fourth wiring layer W4 and the sixth wiring layer W6, and the structure that the second inductor L2 electrically coupled between the third capacitor C3 and the fourth capacitor C4 forms the LC filter circuit. The positional relationships among the fourth wiring layer W4, the fifth wiring layer W5, and the sixth wiring layer W6 is similar to the positional relationships among the first wiring layer W1, the second wiring layer W2, and the third wiring layer W3, so they are not repeated here to avoid duplicity.

Figure 6:
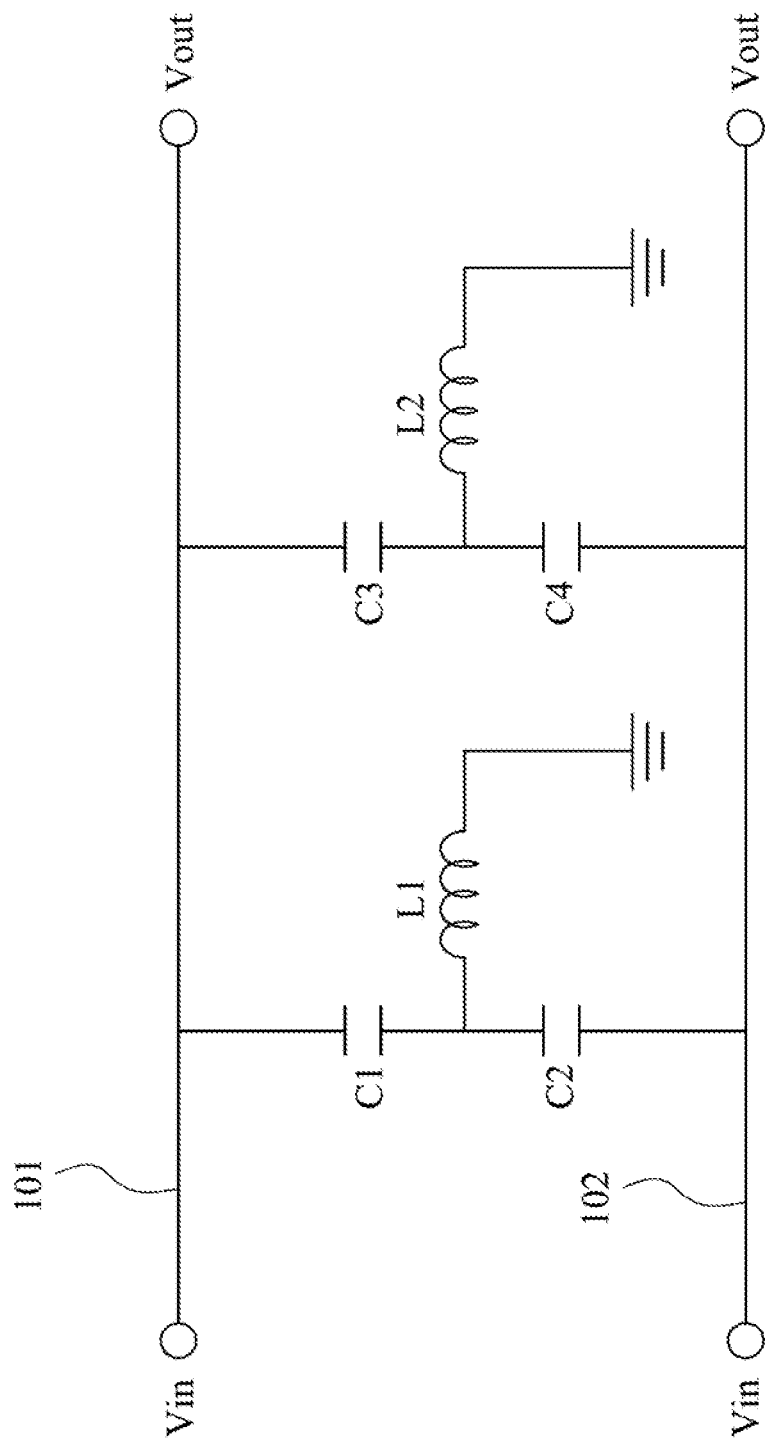
FIG. 6 is an equivalent circuit diagram of common-mode filters according to an embodiment of the disclosure.
Figure 7:
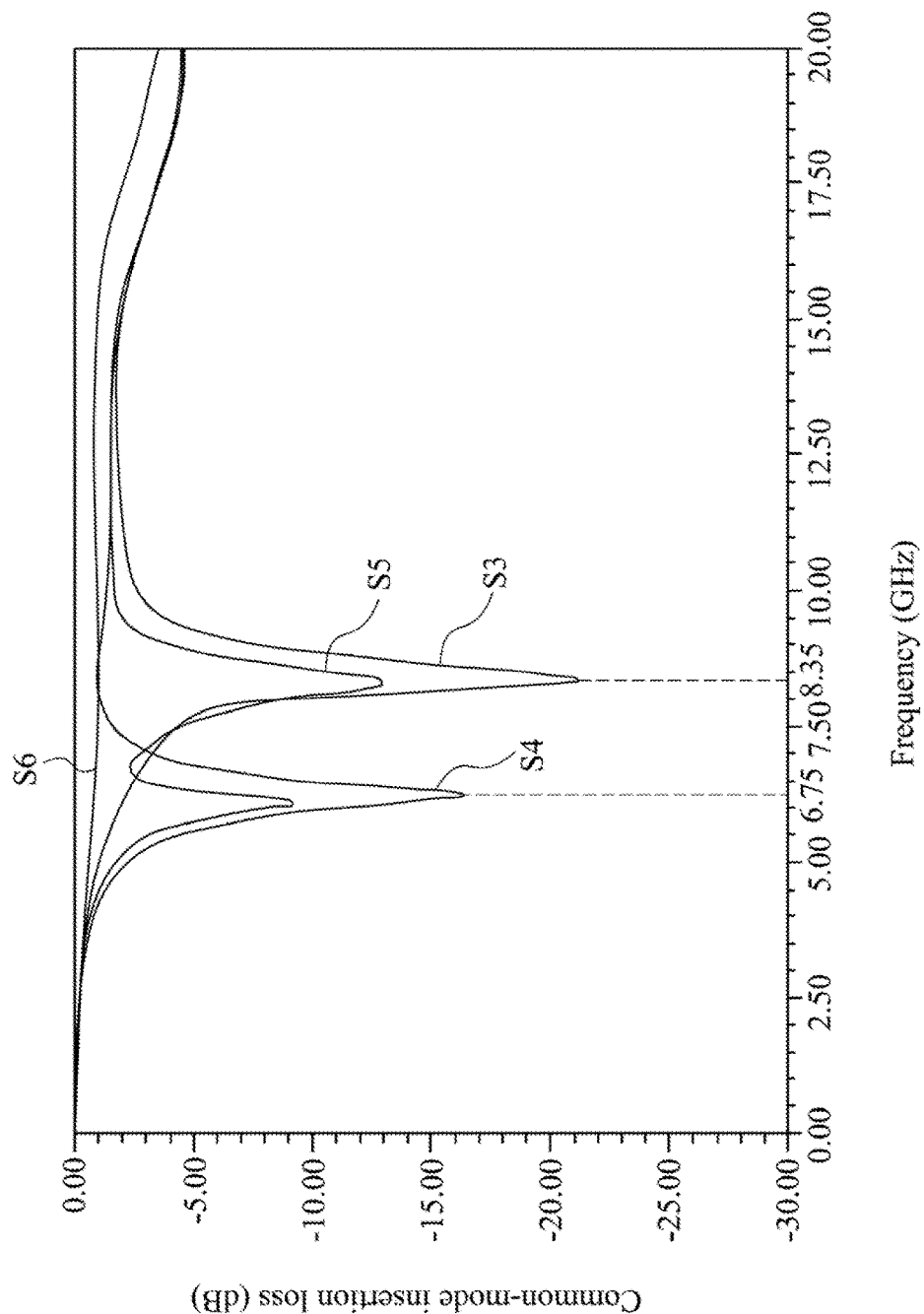
FIG. 7 is an analysis diagram of insertion loss of common-mode noises of common-mode filters according to an embodiment of the disclosure.

Referring to FIG. 6 and FIG. 7, FIG. 6 is an equivalent circuit diagram of common-mode filters 100, 200 according to an embodiment of the disclosure. FIG. 7 is an analysis diagram of insertion loss of common-mode noises of the common-mode filters 100, 200 according to an embodiment of the disclosure. As shown in the figures, the common-mode filters 100, 200 in parallel connection can filter common-mode noises having two different center frequencies in the circuit structure 10. It can be seen from FIG. 7 that when the circuit structure 10 only has the common-mode filter 100 or the common-mode filter 200, the common-mode noises S3, S4 can obtain larger insertion losses (larger than 15 dB) respectively at the frequencies of 8.35 GHz and 6.75 GHz. When the circuit structure 10 has the common-mode filter 100 and the common-mode filter 200 at the same time, the insertion losses of the common-mode noise S5 respectively at the frequencies of 8.35 GHz and 6.75 GHz are slightly decreased (between 8 dB and 13 dB). However, when the circuit structure 10 has no common-mode filter, the insertion losses of the common-mode noise S6 respectively at the frequencies of 8.35 GHz and 6.75 GHz are smaller than 1 dB. Accordingly, by forming the common-mode filters 100, 200 in the circuit structure 10, the common-mode noises having two different center frequencies in the circuit structure 10 can be effectively filtered.

Referring back to FIG. 1 to FIG. 3. In an embodiment, the circuit structure 10 further includes a first conductive solder ball 121 and a second conductive solder ball 122. The first conductive solder ball 121 and the second conductive solder ball 122 are located at a side of the sixth wiring layer W6 facing away from the fifth wiring layer W5, and the first conductive solder ball 121 and the second conductive solder ball 122 are electrically coupled with the first transmission line 101 and the second transmission line 102, respectively.

In an embodiment, the circuit structure 10 can be a multi-layer printed circuit board. The first conductive solder ball 121 and the second conductive solder ball 122 can be external connection points of the circuit structure 10. The first transmission line 101 and the second transmission line 102 can be electrically coupled with a chip (not shown) of the circuit structure 10.

In an embodiment, the first wiring layer W1, the second wiring layer W2, the third wiring layer W3, the fourth wiring layer W4, the fifth wiring layer W5, and the sixth wiring layer W6 can include various conductive lines. It should be noted that in the embodiments shown in FIG. 1 to FIG. 3, except the related conductive lines of the common-mode filters 100, 200, other conductive lines of the first wiring layer W1, the second wiring layer W2, the third wiring layer W3, the fourth wiring layer W4, the fifth wiring layer W5, and the sixth wiring layer W6 are not illustrated in FIG. 1 to FIG. 3.

In an embodiment, the circuit structure 10 can further include a power-wiring layer W7 (shown in FIG. 1), and the power-wiring layer W7 can be electrically coupled with an external power circuit. In addition, should be noted that in some embodiments, a dielectric layer can be included between any two adjacent ones of the first wiring layer W1, the second wiring layer W2, the third wiring layer W3, the fourth wiring layer W4, the fifth wiring layer W5, the sixth wiring layer W6, and the power-.wiring layer W7, so as to prevent the conductive lines in the different wiring layers from forming short circuits.

In an embodiment, the first transmission line 101 and the second transmission line 102 can be, for example, planar micro strip lines having elongated shapes, but the disclosure is not limited in this regard. The first wiring layer W1, the second wiring layer W2, the third wiring layer W3, the fourth wiring layer W4, the fifth wiring layer W5, and the sixth wiring layer W6 can be, for example, rectangular electrode plates, but the disclosure is not limited in this regard. The first inductor L1 and the second inductor L2 can be planar inductor devices, such as planar spiral inductors or planar meander inductors. For example, in the embodiments shown in FIG. 1 and FIG. 2, each of the first inductor L1 and the second inductor L2 can be a planar spiral inductor which includes at least one coil portion across (FIG. 2), and the coil portion 107 can be electrically coupled between the second conductive plate 108 and a ground potential. Specifically, the coil portion 107 can be helically wound into an internal point 107b (FIG. 2) from an end 107a (FIG. 2), in which the end 107a can be electrically coupled with the second conductive plate 108, and the internal point 107b can be electrically coupled with the ground potential.

To sum up, the circuit structure of the disclosure can form a common-mode filter in the transmission paths of differential transmission lines, so as to suppress the common-mode noises in differential-mode signals. Furthermore, the circuit structure can have a plurality of wiring layers. The differential transmission lines must be connected in different wiring layers via through holes. The circuit structure of the present disclosure can form structures of capacitor and inductor between two through holes, so as to form a LC filter circuit. Accordingly, the circuit structure of the disclosure can form a common-mode filter in the transmission paths of the transmission lines without increasing the existing circuit layout area, and the circuit structure is simple to manufacture without occupying a lot of area.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fail within the scope of the following claims.

What is claimed is:

1. A common-mode filter, comprising:
a first transmission line;
a second transmission line;
a first wiring layer comprising a first conductive capacitor plate, wherein at least a part of the first transmission line is located in the first wiring layer, and the first transmission line is electrically coupled with the first conductive capacitor plate;
a second wiring layer comprising a second conductive plate and a first inductor, the second conductive capacitor plate being electrically coupled with the first inductor; and
a third wiring layer comprising a third conductive capacitor plate, wherein at least a part of the second transmission line is located in the second wiring layer, and the second transmission line is electrically coupled with the third conductive capacitor plate;
wherein at least a part of the first conductive capacitor plate faces the second conductive capacitor plate, and at least a part of the second conductive capacitor plate faces the third conductive capacitor plate.

2. The common-mode filter of claim 1, wherein the second wiring layer is located between the first wiring layer and the third wiring layer.

3. The common-mode filter of claim 1, wherein the first inductor is a planar inductor device, and the first inductor is electrically coupled with a ground potential.

4. The common-mode filter of claim 1, further comprising:
a first dielectric layer located between the first wiring layer and the second wiring layer; and
a second dielectric layer located between the second wiring layer and the third wiring layer.

5. A circuit structure, comprising:
a first transmission line;
a second transmission line;
a first wiring layer comprising a first conductive capacitor plate, wherein at least a part of the first transmission line is located in the first wiring layer, and the first transmission line is electrically coupled with the first conductive capacitor plate;
a second wiring layer comprising a second conductive plate and a first inductor, the second conductive capacitor plate being electrically coupled with the first inductor; and a third wiring layer comprising a third conductive capacitor plate; and
a first through hole extending through the first wiring layer, the second wiring layer, and the third wiring layer, wherein the second transmission line is electrically coupled with the third conductive capacitor plate via the first through hole;
wherein at least a part of the first conductive capacitor plate faces the second conductive capacitor plate, and at least a part of the second conductive capacitor plate faces the third conductive capacitor plate.

6. The circuit structure of claim 5, further comprising:
a second through hole extending through the first wiring layer, the second wiring layer, and the third wiring layer, wherein at least a part of the first transmission line is located in the second through hole, and the first conductive capacitor plate, the second conductive capacitor plate, and the third conductive capacitor plate are located between the first through hole and the second through hole.

7. The circuit structure of claim 5, wherein the second wiring layer is located between the first wiring layer and the third wiring layer.

8. The circuit structure of claim 5, wherein the first inductor is a planar inductor device, and an end of the first inductor is helically wound into an internal point, the first inductor is electrically coupled with a ground potential via the internal point, and another end is electrically coupled with the second conductive capacitor plate.

9. The circuit structure of claim 5, further comprising:
a first dielectric layer located between the first wiring layer and the second wiring layer; and
a second dielectric layer located between the second wiring layer and the third wiring layer.

10. The circuit structure of claim 5, further comprising:
a fourth wiring layer comprising a fourth conductive capacitor plate;
a fifth wiring layer comprising a fifth conductive plate and a second inductor, the fifth conductive capacitor plate being electrically coupled with the second inductor; and
a sixth wiring layer comprising a sixth conductive capacitor plate, wherein at least a part of the fourth conductive capacitor plate faces the fifth conductive capacitor plate, and at least a part of the fifth conductive capacitor plate faces the sixth conductive capacitor plate; and
a second through hole extending through the first wiring layer, the second wiring layer, the third wiring layer, the fourth wiring layer, the fifth wiring layer, and the sixth wiring layer, wherein the first transmission line is electrically coupled with the sixth conductive capacitor plate via the second through hole;
wherein the first through hole is further extending through the fourth wiring layer, the fifth wiring layer, and the sixth wiring layer, and the second transmission line is electrically coupled with the fourth conductive capacitor plate via the first through hole.

11. The circuit structure of claim 10, wherein the fourth conductive capacitor plate, the fifth conductive capacitor plate, and the sixth conductive capacitor plate are located between the first through hole and the second through hole.

12. The circuit structure of claim 10, wherein the fifth wiring layer is located between the fourth wiring layer and the sixth wiring layer.

13. The circuit structure of claim 12, further comprising a first conductive solder ball and a second conductive solder ball, wherein the first conductive solder ball and the second conductive solder ball are located at a side of the sixth wiring layer facing away from the fifth wiring layer, and the first conductive solder ball and the second conductive solder ball are electrically coupled with the first transmission line and the second transmission line, respectively.

14. The circuit structure of claim 10, wherein the second inductor is a planar inductor device, the second inductor comprises a coil portion, and the coil portion is electrically coupled between the fifth conductive capacitor plate and a ground potential.

15. The circuit structure of claim 10, wherein any two adjacent ones of the first wiring layer, the second wiring layer, and the third wiring layer are separated by a first distance; any two adjacent ones of the fourth wiring layer, the fifth wiring layer, and the sixth wiring layer are separated by the first distance; and the third wiring layer and the fourth wiring layer are separated by a second distance, and the second distance is greater than the first distance.

* * * * *